US009607865B2

(12) United States Patent
Hayashi et al.

(10) Patent No.: US 9,607,865 B2
(45) Date of Patent: Mar. 28, 2017

(54) SUBSTRATE PROCESSING DEVICE AND SUBSTRATE PROCESSING METHOD

(71) Applicant: SHIBAURA MECHATRONICS CORPORATION, Yokohama-shi, Kanagawa (JP)

(72) Inventors: Konosuke Hayashi, Yokohama (JP); Masaaki Furuya, Yokohama (JP); Takashi Ootagaki, Yokohama (JP); Yuji Nagashima, Yokohama (JP); Atsushi Kinase, Yokohama (JP); Masahiro Abe, Yokohama (JP)

(73) Assignee: SHIBAURA MECHATRONICS CORPORATION, Yokohama-Shi (JP)

( * ) Notice: Subject to any disclaimer, the term of this patent is extended or adjusted under 35 U.S.C. 154(b) by 0 days.

(21) Appl. No.: 14/212,218

(22) Filed: Mar. 14, 2014

(65) Prior Publication Data

US 2014/0261549 A1 Sep. 18, 2014

(30) Foreign Application Priority Data

Mar. 18, 2013 (JP) .................................. 2013-054567
Feb. 18, 2014 (JP) .................................. 2014-029000

(51) Int. Cl.
*H01L 21/67* (2006.01)
*H01L 21/677* (2006.01)

(52) U.S. Cl.
CPC .. *H01L 21/67051* (2013.01); *H01L 21/67028* (2013.01); *H01L 21/67034* (2013.01); *H01L 21/6776* (2013.01)

(58) Field of Classification Search
CPC ......... H01L 21/67028; H01L 21/67034; H01L 21/67051; H01L 21/6776
See application file for complete search history.

(56) References Cited

U.S. PATENT DOCUMENTS 6,033,135 A 3/2000 An et al.
6,173,468 B1 1/2001 Yonemizu et al.
(Continued)

FOREIGN PATENT DOCUMENTS

CN 1194454 A 9/1998
CN 102810498 A 12/2012
(Continued)

OTHER PUBLICATIONS

English Machine Translation of Description of JP 2008128567 (Yokouchi et al., Jun. 2008).*
(Continued)

*Primary Examiner* — Joseph L Perrin
*Assistant Examiner* — Irina Graf
(74) *Attorney, Agent, or Firm* — Birch, Stewart, Kolasch & Birch, LLP (57) ABSTRACT

A substrate processing device 100 includes a cleaning liquid supply unit 114 supplying a cleaning liquid to a surface of a substrate W, a solvent supply unit 115 supplying a volatile solvent to the surface of the substrate W supplied with the cleaning liquid to replace the cleaning liquid on the surface of the substrate W with the volatile solvent, a heating unit 117 heating the substrate W supplied with the volatile solvent, and a drying unit 118 drying the surface of the substrate W by removing a droplet of the volatile solvent produced on the surface of the substrate W by a heating operation of the heating unit 117, and the heating unit 117 and the drying unit 118 are arranged in a course of transportation of the substrate W transported from the solvent supply unit 115.

7 Claims, 7 Drawing Sheets

(56) References Cited

U.S. PATENT DOCUMENTS

| | | | |
|---|---|---|---|
| 6,271,149 B1 * | 8/2001 | Kondo | H01L 31/18 430/127 |
| 7,000,621 B1 * | 2/2006 | Verhaverbeke | B08B 3/12 134/122 R |
| 8,097,091 B2 | 1/2012 | Rastegar et al. | |
| 2002/0017315 A1 * | 2/2002 | Kamikawa | B08B 3/08 134/61 |
| 2003/0054668 A1 * | 3/2003 | Kitano | H01L 21/67034 438/782 |
| 2004/0014298 A1 | 1/2004 | Ehrke et al. | |
| 2006/0228897 A1 | 10/2006 | Timans | |
| 2006/0231125 A1 | 10/2006 | Yi | |
| 2007/0295365 A1 | 12/2007 | Miya et al. | |
| 2009/0139977 A1 | 6/2009 | Falter | |
| 2010/0112225 A1 * | 5/2010 | Sato | B05D 3/105 427/335 |
| 2011/0155177 A1 | 6/2011 | Tamura et al. | |
| 2012/0132230 A1 * | 5/2012 | Toshima | H01L 21/6719 134/19 |
| 2012/0160274 A1 | 6/2012 | Kasai et al. | |
| 2012/0260517 A1 | 10/2012 | Lenz et al. | |
| 2012/0304485 A1 * | 12/2012 | Hayashi | H01L 21/02057 34/415 |
| 2012/0304921 A1 * | 12/2012 | Miyamoto | H01L 21/67109 118/58 |
| 2013/0025155 A1 | 1/2013 | Kim et al. | |
| 2014/0144464 A1 | 5/2014 | Kaneko et al. | |

FOREIGN PATENT DOCUMENTS

| | | | |
|---|---|---|---|
| JP | 62-92325 A | | 4/1987 |
| JP | 9-148297 A | | 6/1997 |
| JP | 11-340187 A | | 12/1999 |
| JP | 11-354487 A | | 12/1999 |
| JP | 2003229404 A | * | 8/2003 |
| JP | 2004-259734 A | | 9/2004 |
| JP | 2008-34779 A | | 2/2008 |
| JP | 2008-128567 A | | 6/2008 |
| JP | 2009076856 A | * | 4/2009 |
| KR | 10-2011-0028532 A | | 3/2011 |
| KR | 10-2012-0074198 A | | 7/2012 |
| TW | 200735164 | | 9/2007 |
| TW | 201308476 A1 | | 2/2013 |
| TW | 201308499 A1 | | 2/2013 |

OTHER PUBLICATIONS

English Machine Translation of Description of JPH09148297 A (Hiroshi, Jun. 1997).*

English Machine Translation of Description of JP 20090766856 A (Kazuo, 04-12009).*

English Machine Translation of Description of JP 2003-229404 A (Tetsuya et al. Aug. 2003.*

Extended European Search Report, dated Sep. 18, 2014, for European Application No. 14160175.7.

Non-Final Office Action of related U.S. Appl. No. 14/212,382 issued on Sep. 10, 2015.

Non-Final Office Action of related U.S. Appl. No. 14/212,899 issued on Sep. 29, 2015.

Final Office Action of related U.S. Appl. No. 14/212,382, dated Feb. 2, 2016.

U.S. Office Action, dated Jun. 3, 2016, for U.S. Appl. No. 14/212,382.

Non-Final Office Action of related U.S. Appl. No. 14/212,899 issued on Aug. 8, 2016.

* cited by examiner

SUBSTRATE PROCESSING DEVICE AND SUBSTRATE PROCESSING METHOD

The disclosure of Japanese Patent Application No. 2013-054567 filed Mar. 18, 2013 and Japanese Patent Application No. 2014-029000 filed Feb. 18, 2014 including specifications, drawings and claims is incorporated herein by reference in its entirety, claiming the benefit of their priorities.

FIELD OF THE INVENTION

The present intention relates to a substrate processing device and a substrate processing method.

RELATED ART

In manufacturing semiconductors and others, a substrate processing device supplies a processing liquid to a surface of a substrate of a wafer, a liquid crystal substrate or the like to process a surface of the substrate, then supplies a cleaning liquid such as ultrapure water to the substrate surface to clean the substrate surface, and further dries it. In the drying, there are problems that occur with patterns, e.g., around memory cells and gates collapses due to miniaturization according to increase in integration degree and capacity of the semiconductors in recent years. This is due to spacing between patterns, structures of them, a surface tension of the cleaning liquid and others.

Accordingly, for the purpose of suppressing the pattern collapsing, such a substrate drying method has been proposed (e.g., see Japanese Patent Application Publication No. 2008-34779 (Patent Literature 1)) that uses IPA (2-Propanol: Isopropyl Alcohol) having a smaller surface tension than the ultrapure water, and mass production factories and others have employed a method of drying the substrate by replacing the ultrapure water on the substrate surface with the IPA.
[Patent Literature 1] Japanese Patent Application Publication No. 2008-34779

SUMMARY OF THE INVENTION

Problems to be Solved by the Invention

However, the semiconductors have been increasingly miniaturized, and even the drying that uses a liquid such as organic solvent (e.g., IPA) or the like of a small surface tension may collapse fine patterns of wafers due to the surface tension and the like of the liquid.

Figure 7A:
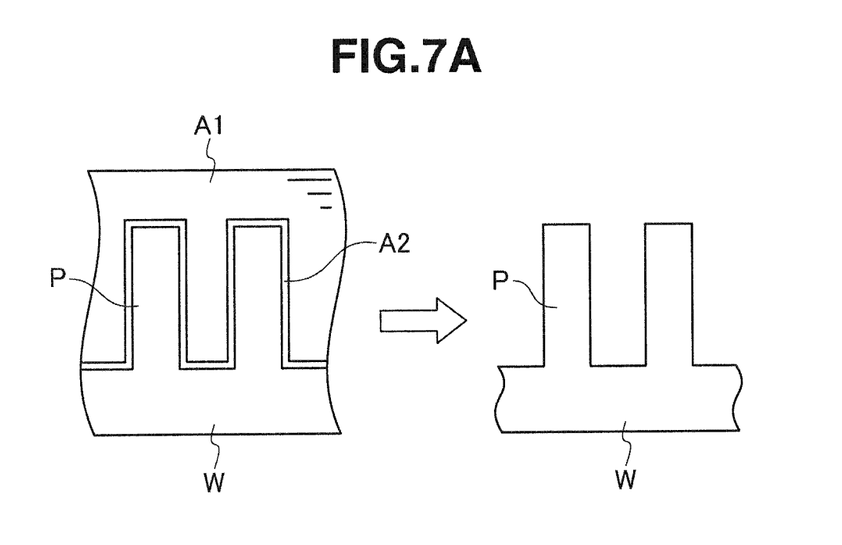
FIGS. 7A and 7B are schematic views illustrating a state of drying of a volatile solvent on a substrate surface.
Figure 7B:
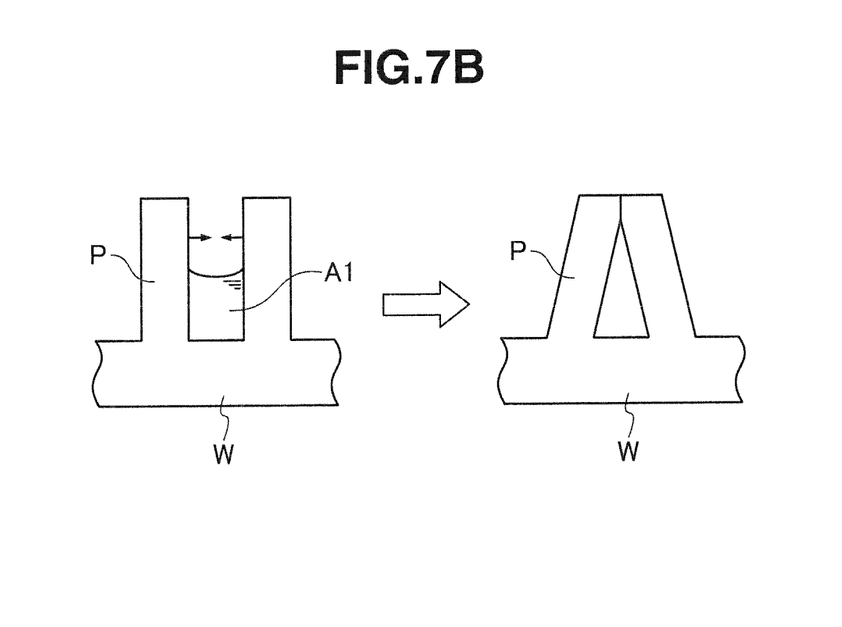

For example, during a liquid drying process, unequal speeds of drying are caused in various portions of a surface of a substrate W and, as illustrated in FIG. 7B, when a liquid A1 remains between some patterns P, a pattern collapse is caused by the surface tension of the liquid A1 between them. In particular, the patterns located in the portion where the liquid remains are mutually pulled by the surface tension of the liquid, and elastically deform to collapse, and a slight amount of residues dissolved into the liquid condenses. When the liquid is completely dried thereafter, the collapsed patterns are fixedly adhered together due to interposition or the like of the residues.

Also, a time required for a series of operations of cleaning and drying the surface of the substrate tends to increases in accordance with increase in size of the wafer, the liquid crystal substrate and the like, and it has been required to improve productivity of them.

An object of the invention is to dry instantaneously a liquid on a surface during drying of a substrate, and to improve productivity of the substrate.

Means for Solving the Problems

A substrate processing device according to the invention includes a cleaning liquid supply unit supplying a cleaning liquid to a surface of a substrate, a solvent supply unit supplying a volatile solvent to the surface of the substrate supplied with the cleaning liquid to replace the cleaning liquid on the surface of the substrate with the volatile solvent, a heating unit heating the substrate supplied with the volatile solvent, and a drying unit drying the surface of the substrate by removing a droplet of the volatile solvent produced on the surface of the substrate by a heating operation of the heating unit, and the heating unit and the drying unit are arranged in a course of transportation of the substrate transported from the solvent supply unit.

A substrate processing method according to the invention includes supplying a cleaning liquid to a surface of a substrate, supplying a volatile solvent to the surface of the substrate supplied with the cleaning liquid to replace the cleaning liquid on the surface of the substrate with the volatile solvent, heating the substrate supplied with the volatile solvent, and drying the surface of the substrate by removing a droplet of the volatile solvent produced on the surface of the substrate by heating of the substrate, wherein the heating and the drying are set in a course of transportation of the substrate supplied with the volatile solvent.

Effect of the Invention

The substrate processing device and the substrate processing method of the invention can instantaneously dry the liquid on the surface of the substrate at the time of drying the substrate, and can improve the productivity of the substrate.

DETAILED DESCRIPTION

Embodiment 1

FIGS. 1-4

Figure 1:
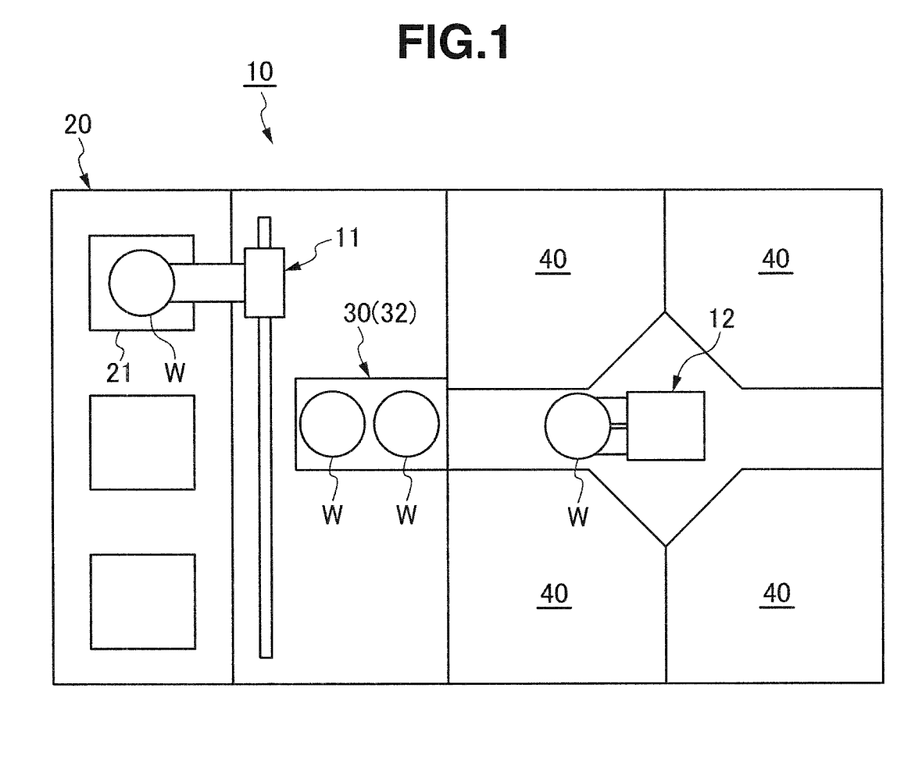
FIG. 1 is a schematic view illustrating a substrate processing device of Embodiment 1.

As illustrated in FIG. 1, a substrate processing device 10 of Embodiment 1 has a substrate supply/discharge unit 20, a substrate storing buffer unit 30, a plurality of substrate cleaning chambers 40, and a substrate drying chamber 60 arranged in an out-dedicated buffer 32 which is employed in the substrate storing buffer unit 30 and will be described later. A transporting robot 11 is arranged between the substrate supply/discharge unit 20 and the substrate storing buffer unit 30, and a transporting robot 12 is arranged between the substrate storing buffer unit 30 and the substrate cleaning chamber 40.

A plurality of substrate accommodation cassettes 21 can be supplied to and discharged from the substrate supply/discharge unit 20. The substrate accommodation cassette 21 which has accommodated a plurality of substrates W such as unprocessed wafers, liquid crystal substrates or the like is supplied to the substrate supply/discharge unit 20, and will be discharged from the substrate supply/discharge unit 20 together with the accommodated substrates W which are processed in the substrate cleaning chamber 40 and the substrate drying chamber 60. The unprocessed substrates W are successively taken out by the transporting robot 11 from multi-level accommodation shelves of the substrate accommodation cassette 21 in the substrate supply/discharge unit 20, are supplied to an in-dedicated buffer 31 (not illustrated) to be described later in the substrate storing buffer unit 30, further are taken out by the transporting robot 12 from the in-dedicated buffer 31 of the substrate storing buffer unit 30, and are supplied to the substrate cleaning chamber 40 for cleaning. The transporting robot 12 takes out the substrate W cleaned in the substrate cleaning chamber 40 from the substrate cleaning chamber 40, and feeds it to the out-dedicated buffer 32 to be described later of the substrate storing buffer unit 30. Then, the transporting robot 11 takes the substrates W after being dried in the substrate drying chamber 60 in the out-dedicated buffer 32 of the substrate storing buffer unit 30, and successively discharges the substrates W to the empty accommodation shelves in the substrate accommodation cassette 21 of the substrate supply/discharge unit 20. The substrate accommodation cassette 21 filled with the processed substrates W is transported from the substrate supply/discharge unit 20.

The substrate storing buffer unit 30 has the plurality of in-dedicated buffers 31 arranged in the multi-shelf form for storing the unprocessed substrates W, and has the plurality of out-dedicated buffers 32 arranged in the multi-shelf form for storing the substrates W cleaned in the substrate cleaning chamber 40. The substrate drying chamber 60 is arranged in the out-dedicated buffer 32 as will be described later. The in-dedicated buffer 31 and the out-dedicated buffer 32 may not have the multi-shelf form.

Figure 2:
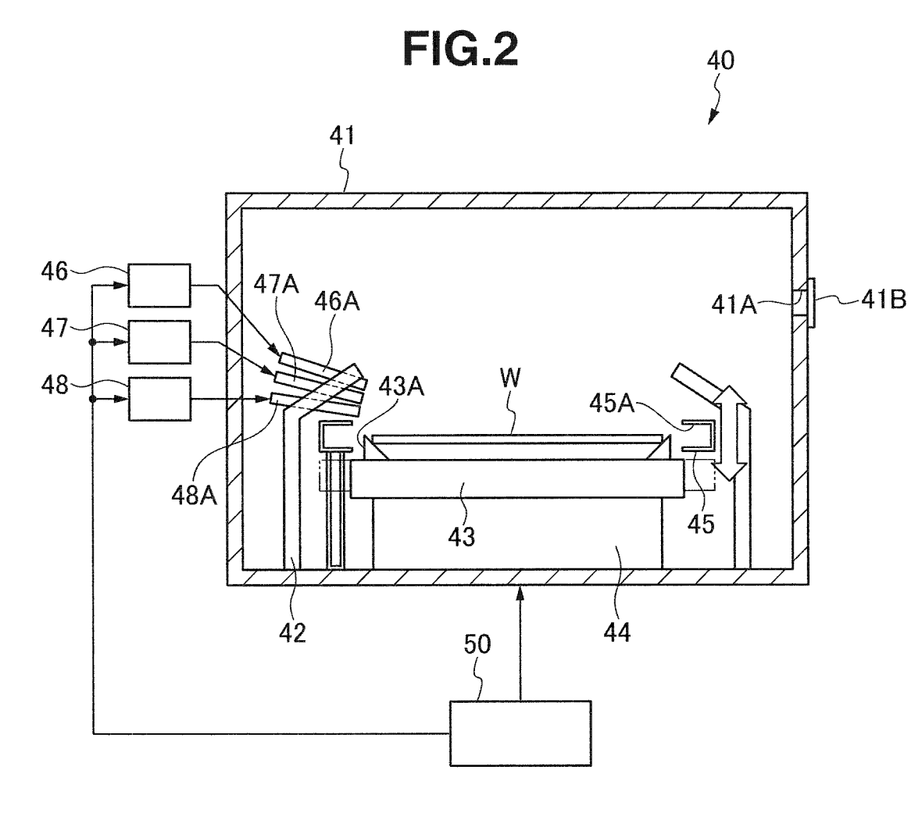
FIG. 2 is a schematic view illustrating a structure of a substrate cleaning chamber of the substrate processing device.

The substrate cleaning chamber 40 includes, as illustrated in FIG. 2, a processing box 41 forming a processing chamber, a cup 42 arranged in the processing box 41, a table 43 carrying the substrate W in a horizontal position in the cup 42, a rotation mechanism 44 rotating the table 43 in a horizontal plane, and a solvent suction discharging unit 45 that can vertically move around the table 43. The substrate cleaning chamber 40 further includes a chemical solution supply unit 46 supplying a chemical solution to a surface of the substrate W on the table 43, a cleaning liquid supply unit 47 supplying a cleaning liquid to the surface of the substrate W on the table 43, a solvent supply unit 48 supplying a volatile solvent, and a controller 50 controlling the various units.

The processing box 41 has a substrate inlet/outlet opening 41A opening at a portion of its peripheral wall. A shutter 41B can close and open the substrate inlet/outlet opening 41A.

The cup 42 has a cylindrical form, surrounds the periphery of the table 43, and accommodates it. The cup 42 has a peripheral wall having an upper portion tapered to converge upward, and has an opening to expose the substrate W on the table 43 upward. This cup 42 receives the chemical solution and cleaning liquid that flow or disperse from the rotating substrate W. The cup 42 is provided at its bottom with a discharge pipe (not illustrated) for discharging the received chemical solution and cleaning liquid.

The table 43 is positioned near a center of the cup 42, and is rotatable in the horizontal plane. The table 43 has a plurality of support members 43A such as pins, which removably hold the substrate W such as a wafer or a liquid crystal substrate.

The rotation mechanism 44 has a rotation axis coupled to the table 43, a motor serving as a drive source for rotating the rotation shaft, and others (not illustrated), and rotates the table 43 by the driving of the motor through the rotation shaft. The rotation mechanism 44 is electrically connected to the controller 50, which controls the drive of the rotation mechanism 44.

The solvent suction discharging unit 45 includes a solvent absorbing port 45A having an annular opening surrounding the periphery of the table 43. The solvent suction discharging unit 45 has an elevator mechanism (not illustrated) for vertically moving the solvent absorbing port 45A, and vertically moves the solvent absorbing port 45A between a standby position where the solvent absorbing port 45A is positioned lower than the table surface of the table 43 and an operation position where the solvent absorbing port 45A is positioned around the substrate W held by the table 43. The solvent absorbing port 45A absorbs and receives the volatile solvent dispersed from the rotating substrate W. The solvent absorbing port 45A is connected to an exhaust fan or a vacuum pump (not illustrated) for absorbing the volatile solvent as well as an exhaust pipe (not illustrated) for discharging the volatile solvent that is absorbed and received.

The chemical solution supply unit 46 has a nozzle 46A discharging the chemical solution obliquely to the surface of the substrate W on the table 43, and supplies the chemical solution such as APM (Ammonia and hydrogen Peroxide Mixture) for resist peeling processing to the surface of the substrate W on the table 43 through the nozzle 46A. The nozzle 46A is attached to an upper portion of the peripheral wall of the cup 42, and its angle, discharging flow velocity and others are adjusted to supply the chemical solution to the vicinity of the surface center of the substrate W. The chemical solution supply unit 46 is electrically connected to the controller 50, which controls the drive of the chemical solution supply unit 46. The chemical solution supply unit 46 includes a tank storing the chemical solution, a pump serving as a drive source, a valve serving as a regulator valve regulating a supply rate, and others, although not illustrated.

The cleaning liquid supply unit 47 has a nozzle 47A discharging the cleaning liquid obliquely to the surface of the substrate W on the table 43, and supplies the cleaning liquid such as pure water (ultrapure water) for cleaning processing to the surface of the substrate W on the table 43 through the nozzle 47A. The nozzle 47A is attached to the upper portion of the peripheral wall of the cup 42, and its angle, discharging flow velocity and others are adjusted to supply the chemical solution to the vicinity of the surface center of the substrate W. The cleaning liquid supply unit 47 is electrically connected to the controller 50, which controls the drive of the cleaning liquid supply unit 47. The cleaning liquid supply unit 47 includes a tank storing the cleaning liquid, a pump serving as a drive source, and a valve serving as a regulator valve regulating a supply rate, although not illustrated.

The solvent supply unit 48 has a nozzle 48A discharging the volatile solvent obliquely to the surface of the substrate W on the table 43, and supplies the volatile solvent such as IPA to the surface of the substrate W on the table 43 through the nozzle 48A. The solvent supply unit 48 supplies the volatile solvent to the surface of the substrate W cleaned with the cleaning liquid supplied by the cleaning liquid supply unit 47, and replaces the cleaning liquid on the surface of the substrate W with the volatile solvent. The nozzle 48A is attached to the upper portion of the peripheral wall of the cup 42, and its angle, discharging flow velocity and others are adjusted to supply the volatile solvent to the vicinity of the surface center of the substrate W. The solvent supply unit 48 is electrically connected to the controller 50, which controls the drive of the solvent supply unit 48. The solvent supply unit 48 includes a tank storing the volatile solvent, a pump serving as a drive source, and a valve serving as a regulator valve regulating a supply rate, although not illustrated.

In addition to the IPA, univalent alcohols such as ethanol, and ethers such as diethyl ether and ethyl methyl ether as well as ethylene carbonate and the like may be used as the volatile solvent. The volatile solvent is preferably water-soluble.

The controller 50 includes a microcomputer that centrally controls the various portions, and a storage storing substrate processing information relating to the substrate processing, various kinds of programs and others. The controller 50 controls, based on the substrate processing information and various programs, the rotation mechanism 44, solvent suction discharging unit 45, chemical solution supply unit 46, cleaning liquid supply unit 47, solvent supply unit 48 and others, and controls the supplying of the chemical solution by the chemical solution supply unit 46, supplying of the cleaning liquid by the cleaning liquid supply unit 47, supplying of the volatile solvent by the solvent supply unit 48 performed on the surface of the substrate W on the rotating table 43, and others.

Figure 3:
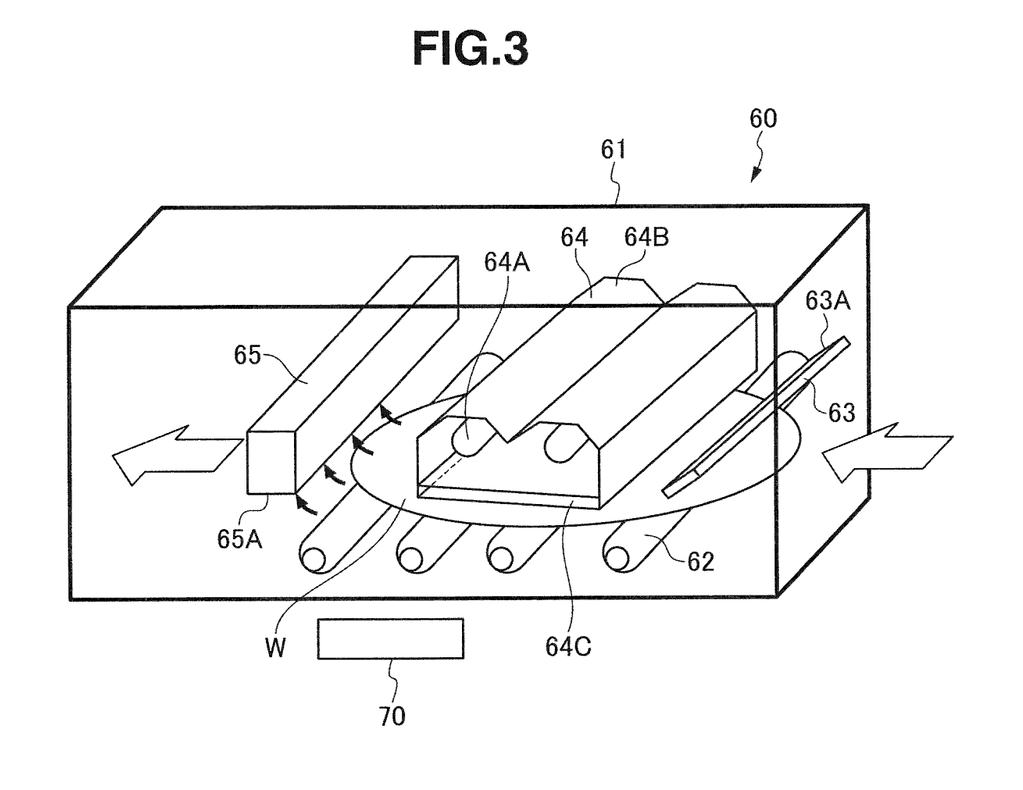
FIG. 3 is a schematic view illustrating a structure of a substrate drying chamber of the substrate processing device.

The substrate drying chamber 60 is arranged for each of the multi-level shelves in the out-dedicated buffer 32 of the substrate storing buffer unit 30, and includes, as illustrated in FIG. 3, a tunnel-like processing box 61 forming a processing chamber, and a plurality of transport rollers 62 forming a transporting unit in the processing box 61. Further, the substrate drying chamber 60 includes a gas supply unit 63 supplying a gas to the surface of the substrate W on the transport rollers 62, a heating unit 64 for heating the substrate W to which the volatile solvent is supplied in the substrate cleaning chamber 40, a suction drying unit 65 for drying the surface of the substrate W heated by the heating unit 64, and a controller 70 controlling various portions. Although the transport rollers 62 are likewise arranged downstream to the position where the suction drying unit 65 is arranged, these are not illustrated in FIG. 3.

The processing box 61 has a tunnel-like form. The substrate W which is subjected to the cleaning processing and is taken out from the substrate cleaning chamber 40 by the transporting robot 12 is fed through an upstream opening of the processing box 61, and the substrate W which is subjected to the drying processing by the substrate drying chamber 60 is discharged by the transporting robot 11 through a downstream opening of the processing box 61.

The transport rollers 62 are driven to rotate by a drive unit such as a motor (not illustrated), and transport the substrate W fed through the upstream opening of the processing box 61 through a lower transport passage of the gas supply unit 63, heating unit 64, and suction drying unit 65 toward the downstream opening. The transport rollers 62 are electrically connected to the controller 70, which controls the drive of the transport rollers 62.

The gas supply unit 63 is located upstream, in the substrate transporting direction of the transport rollers 62, to the heating unit 64, and is arranged above the transport rollers 62. The gas supply unit 63 has a slit-like nozzle 63A obliquely discharging a gas to the widthwise full area of the surface of the substrate W on the transport rollers 62, and supplies through the nozzle 63A a gas such as nitrogen gas to the surface of the substrate W on the transport rollers 62 to form a nitrogen gas atmosphere in the space on the surface of the substrate W in the processing box 61. The nozzle 63A is attached to the processing box 61, and its angle, discharging flow velocity and others are adjusted to supply the gas to the widthwise full area of the surface of the substrate W. This gas supply unit 63 is electrically connected to the controller 70, which controls the drive of the gas supply unit 63. The gas supply unit 63 includes a tank storing the gas, a valve serving as a regulator valve regulating a supply rate, and others, although not illustrated. The supply rate of the gas is adjusted such that the gas discharged from the nozzle 63A may not completely dry the volatile solvent already supplied to the surface of the substrate W.

As the supplied gas, an inert gas such as argon gas, carbon dioxide gas or helium gas other than nitrogen gas can be used. Since the insert gas is supplied to the surface of the substrate W, the oxygen on the surface of the substrate W can be removed, and production of watermarks can be prevented.

The heating unit 64 has a plurality of lamps 64A, and is arranged above the transport rollers 62. When each lamp 64A is turned on, it irradiates the surface of the substrate W on the transport rollers 62 with light. The heating unit 64 heats the substrate W by irradiating the widthwise full area of the surface of the substrate W with the light emitted through a transparent cover 64C from the lamps 64A arranged in a lamp casing 64B attached to the processing box 61. This heating unit 64 is electrically connected to the controller 70, which controls the drive of the heating unit 64.

The heating unit 64 may be formed of the plurality of lamps 64A, e.g., of a straight-tube type arranged in parallel, or the plurality of lamps 64A of a light ball type arranged in an array fashion. The lamp 64A may be, for example, a halogen lamp, xenon flash lamp or the like.

In heating of the substrate W using the heating unit 64, as illustrated in FIG. 7A, the heating by the heating unit 64 causes liquid A1 of the volatile solvent in contact with a pattern P on the surface of the substrate W to start evaporation earlier than the liquid A1 of the volatile solvent on the other portion. More specifically, in the liquid A1 of the volatile solvent supplied to the surface of the substrate W, only the liquid in contact with the surface of the substrate W is rapidly heated to attain the gas phase. Thereby, gasification (boiling) of the liquid A1 of the volatile solvent forms a gas layer (collection of bubbles), namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

The suction drying unit 65 is located downstream, in the substrate transporting direction of the transport rollers 62, from the heating unit 64 and is arranged above the transport rollers 62. The suction drying unit 65 is attached to the processing box 61, and has a solvent suction port 65A of a slit-like form opening toward the widthwise full area of the surface of the substrate W on the transport rollers 62. The suction drying unit 65 applies a suction force provided to the solvent suction port 65A to the widthwise full area of the surface of the substrate W, and dries the surface of the substrate W by absorbing and removing the droplets of the volatile solvent produced on the surface of the substrate W by the heating operation of the heating unit 64 as described above. This suction drying unit 65 is electrically connected to the controller 70, which controls the drive of the suction drying unit 65. A vacuum pump (not illustrated) for absorbing the droplets of the volatile solvent is connected to the solvent suction port 65A.

In the substrate drying chamber 60, a blow-off drying unit may be used together with the suction drying unit 65. This blow-off drying unit blows and removes the droplets of the volatile solvent produced on the surface of the substrate W by an injected gas to dry the surface of the substrate W. The gas supply unit 63 described above may also be used as this blow-off drying unit.

Figure 4:
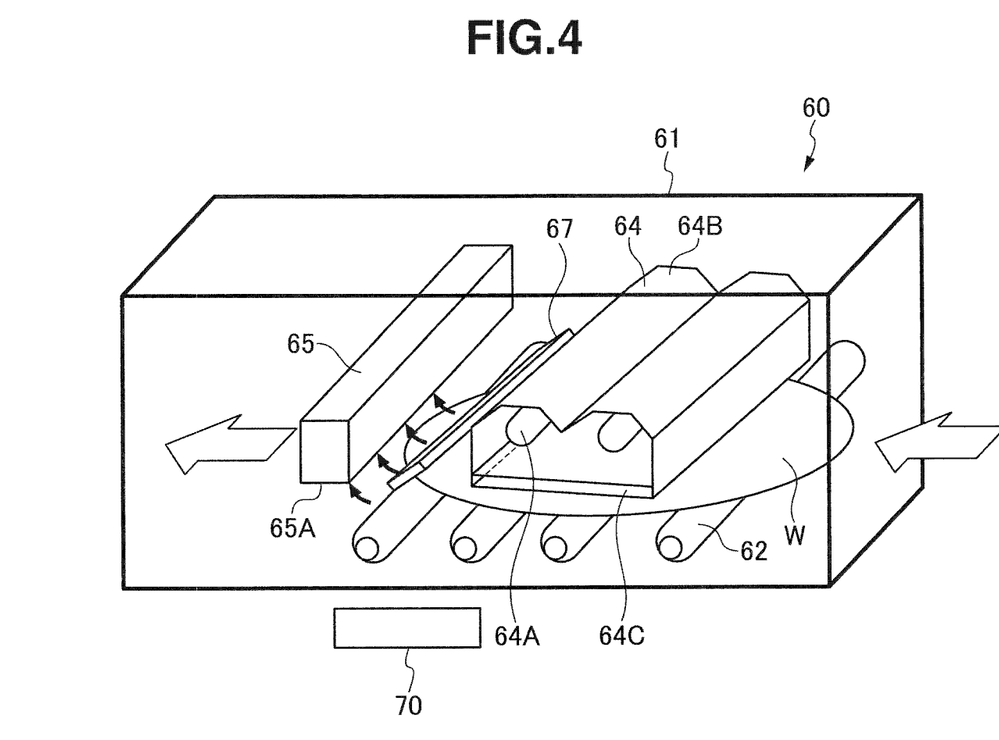
FIG. 4 is a schematic view illustrating a modification of a substrate cleaning chamber of the substrate processing device.

FIG. 4 illustrates a modification of the substrate drying chamber 60. This modification is provided with a blow-off drying unit 67 injecting an inert gas such as nitrogen gas to a downstream side of the heating unit 64 in the substrate transporting direction of the transport rollers 62 when an atmosphere forming unit (not illustrated) controls the space on the surface of the substrate W in the processing box 61 to keep a nitrogen gas atmosphere, and is configured to blow and remove the droplets of the volatile solvent produced on the surface of the substrate W by the blow-off drying unit 67.

The controller 70 includes a microcomputer centrally controlling various portions, and a storage storing the substrate processing information and various programs relating to the substrate processing. The controller 70 controls the gas supply unit 63, heating unit 64, suction drying unit 65 and others based on the substrate processing information and the various programs, and further controls the gas supply unit 63, heating by the heating unit 64, suction force of the suction drying unit 65, and others effected on the surface of the substrate W on the transport rollers 62.

Procedures of cleaning and drying the substrate W by the substrate processing device 10 will now be described below.

(1) The transporting robot 11 supplies the substrate W from the substrate accommodation cassette 21 of the substrate supply/discharge unit 20 to the in-dedicated buffer 31 of the substrate storing buffer unit 30, and the transporting robot 12 takes out and sets the supplied substrate W on the table 43 of the substrate cleaning chamber 40. In this state, the controller 50 of the substrate cleaning chamber 40 controls the rotation mechanism 44 to rotate the table 43 at a predetermined rotation speed, and then controls the chemical solution supply unit 46 while positioning the solvent suction discharging unit 45 in the standby position so that the chemical solution, i.e., APM is supplied from the nozzle 46A to the surface of the substrate W on the rotating table 43 for a predetermined time. The chemical solution, i.e., APM is discharged from the nozzle 46A toward the center of the substrate W on the rotating table 43, and the centrifugal force caused by the rotation of the substrate W spreads it over the whole surface of the substrate W. Thereby, the APM covers and processes the surface of the substrate W on the table 43.

The controller 50 continuously rotates the table 43 for a period from the above (1) to (3) to be described later. In this operation, the processing conditions such as a rotation speed of the table 43, a predetermined time and the like are set in advance, but an operator can arbitrarily change them.

(2) After stopping the supply of the chemical solution, the controller 50 then controls the cleaning liquid supply unit 47 to supply the cleaning liquid, i.e., ultrapure water from the nozzle 47A to the surface of the substrate W on the rotating table 43 for a predetermined time. The cleaning liquid, i.e., ultrapure water is discharged from the nozzle 47A toward the center of the substrate W on the rotating table 43, and is spread over the whole surface of the substrate W by the centrifugal force caused by rotation of the substrate W. Thereby, the surface of the substrate W on the table 43 is covered and cleaned by the ultrapure water.

(3) When the cleaning liquid supply unit 47 ends the cleaning of the substrate W, the controller 50 then locates the solvent suction discharging unit 45 in the operation position, and controls the solvent supply unit 48 to supply the volatile solvent, i.e., IPA from the nozzle 48A to the surface of the substrate W on the rotating table 43 for a predetermined time. It is preferable that IPA be supplied before the ultrapure water above (2) is dried. The volatile solvent, i.e., IPA is discharged from the nozzle 48A toward the center of the substrate W on the rotating table 43, and is spread over the whole surface of the substrate W by the centrifugal force caused by rotation of the substrate W. At this time, the solvent suction discharging unit 45 absorbs the IPA dispersing from the rotating substrate W. Thereby, the ultrapure water on the surface of the substrate W on the table 43 is replaced with the IPA. The rotation speed of the substrate W, i.e., the table 43 in the above operation is substantially set to form a thin film of the volatile solvent over the surface of the substrate W to an extent that the surface of the substrate W is not exposed by forming.

The IPA discharged from the nozzle 48A of the solvent supply unit 48 is set to a temperature below a boiling point so that the IPA may be reliably in the liquid state when it is supplied to the surface of the substrate W, and thereby the ultrapure water may be reliably and uniformly replaced with the IPA on the whole surface of the substrate W.

(4) Then, the controller 50 stops rotation of the table 43 of the substrate cleaning chamber 40, and the transporting robot 12 takes out the substrate W on the rotation-stopped table 43 from the substrate cleaning chamber 40, and feeds the substrate W onto the transport rollers 62 through the upstream opening of the processing box 61 in the substrate drying chamber 60 arranged in the out-dedicated buffer 32 of the substrate storing buffer unit 30. The controller 70 of the substrate drying chamber 60 controls the gas supply unit 63 to supply the gas, i.e., nitrogen gas from the nozzle 63A to the surface of the substrate W on the transport rollers 62 for a predetermined time. The nozzle 63A discharges the nitrogen gas toward the widthwise full area of the substrate W on the transport rollers 62. Thereby, the nitrogen atmosphere is formed in the space containing the substrate W on the transport rollers 62. By keeping the nitrogen atmosphere in this space, the oxygen concentration is reduced to suppress generation of watermarks on the surface of the substrate W.

(5) Then, the controller 70 controls the heating unit 64 to turn on each lamp 64A of the heating unit 64 to heat the substrate W on the transport rollers 62 for a predetermined time. At this time, the heating unit 64 can perform the heating that can raise the temperature of the substrate W to 100 degrees or above in 10 seconds. This can instantaneously vaporize the liquid A1 of the volatile solvent in contact with the pattern P on the surface of the substrate W, and can immediately form the droplets of the liquid A1 of the volatile solvent on the other portion of the surface of the substrate W.

In the above heat drying by the heating unit 64, it is important to heat the substrate W to a high temperature of hundreds of degrees within several seconds for instantaneously evaporating the volatile solvent, i.e., IPA in contact with the pattern P of the substrate W. It is necessary to heat only the substrate W without heating the IPA. For this, it is desirable to use the lamp 64A having a peak intensity in wavelengths of 500-3000 nm. For reliable drying that can reduce a pattern collapse rate, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially within 10 seconds and, for example, falls within a range from several tens of milliseconds to several seconds.

(6) Then, the controller 70 controls the suction drying unit 65 to absorb and remove the droplets of the IPA which were produced on the surface of the substrate W by the heating operation of the heating unit 64 on the transport rollers 62, and thereby dries the surface of the substrate W.

(7) Then, the transporting robot 11 takes out the substrate W which is already washed and dried on the transport rollers 62 through the downstream opening of the processing box 61 in the substrate drying chamber 60 arranged in the out-dedicated buffer 32 of the substrate storing buffer unit 30, and discharges the substrate W to the substrate accommodation cassette 21 of the substrate supply/discharge unit 20.

Accordingly, in the substrate processing device 10, the heating unit 64 and the suction drying unit 65 (the gas supply unit 63 serving as the blow-off drying unit, or the blow-off drying unit 67 may be used together with them) which are provided in the substrate drying chamber 60 arranged for each of the multi-level shelves in the out-dedicated buffer 32 of the substrate storing buffer unit 30 are arranged in the course of transportation of the substrate W transported from the solvent supply unit 48 provided in the substrate cleaning chamber 40, i.e., the course of transportation by the transport rollers 62 in the substrate drying chamber 60. Heating the substrate W by the heating unit 64 in the substrate drying chamber 60 and drying the surface of the substrate W by the suction drying unit 65 are executed in the above transportation, i.e., in the course of transportation of taking out the substrate W supplied with the volatile solvent from the solvent supply unit 48 in the substrate cleaning chamber 40 and transporting the substrate W from the substrate cleaning chamber 40 by the transport rollers 62.

The embodiment achieves the following operation and effect.

(a) The operation of heating the substrate W by the heating unit 64 vaporizes the liquid of the volatile solvent, i.e., IPA used for replacement around the pattern P on the surface of the substrate W so that a gas layer of the vapored IPA forms a thin film around the pattern P on the surface of the substrate W. The liquid of IPA between the neighboring patterns P of the substrate W is pushed out by the gas layer, and is changed into a large number of droplets by its own surface tension. The suction drying unit 65 immediately absorbs the droplets of IPA formed on the surface of the substrate W in this manner and removes them from the surface of the substrate W. Accordingly, the liquid of IPA is dried instantaneously on the whole surface of the substrate W, and the drying speeds of various portions of the surface of the substrate W can be uniform so that no IPA remaining between certain patterns P occurs, and it is possible to suppress collapsing of the patterns P due to the surface tension of the liquid of the remaining IPA.

(b) The heating unit 64 and the suction drying unit 65 are arranged in the course of transportation of the substrate W transported from the solvent supply unit 48. Therefore, the operation of cleaning the following substrate W by the cleaning liquid supply unit 47 and the solvent supply unit 48 and the operation of drying the preceding substrate W by the heating unit 64 and the suction drying unit 65 can be performed in parallel with each other at different positions, respectively, so that the productivity of the substrates W can be improved. Further, the heating unit 64 and the suction drying unit 65 perform the drying operation during the transportation of the substrate W. This can also improve the productivity of the substrates W. Accordingly, even when the substrates W have large sizes, the productivity thereof can be improved.

Embodiment 2

Figure 5:
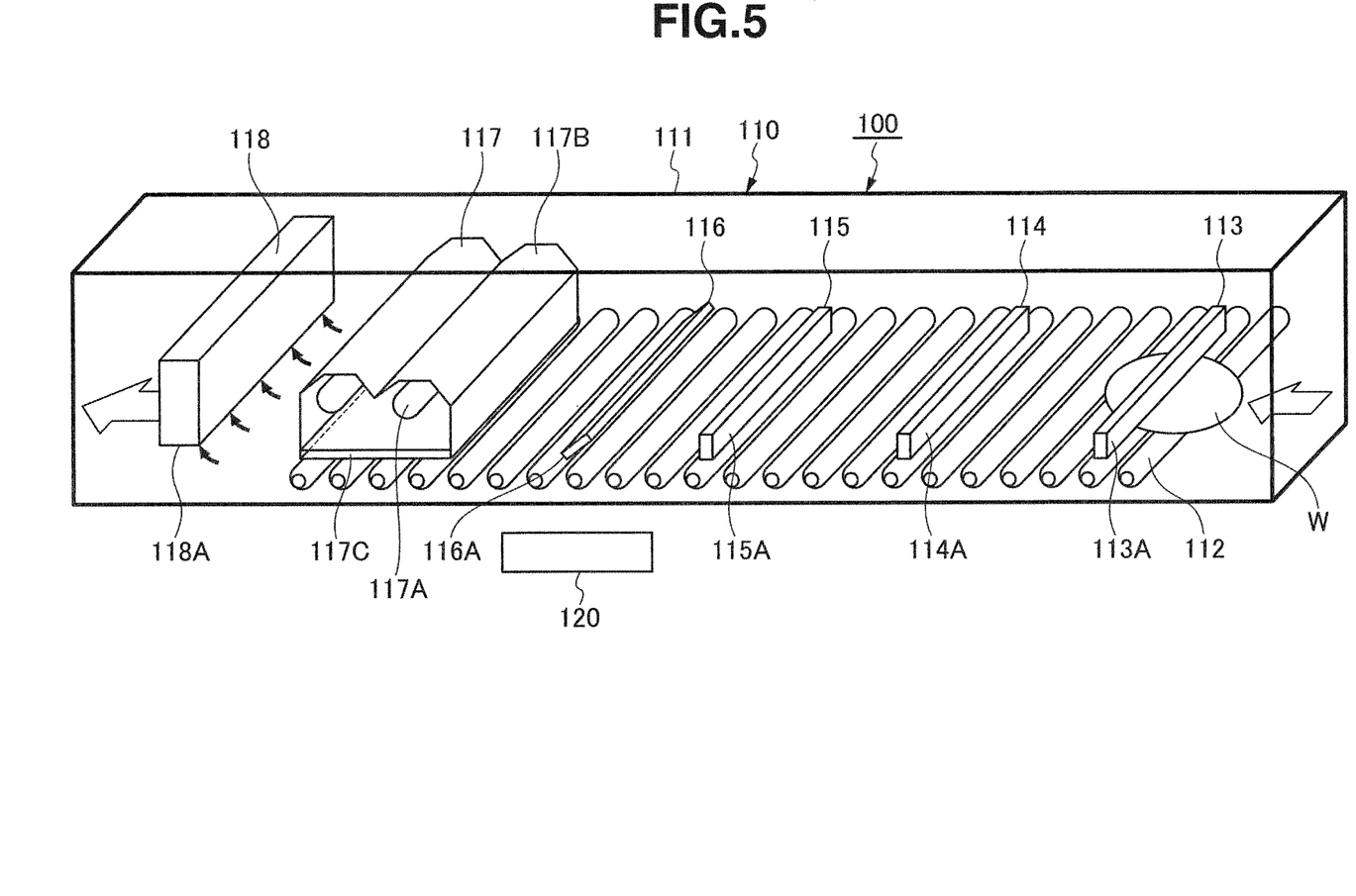
FIG. 5 is a schematic view illustrating a substrate processing device of Embodiment 2.
Figure 6:
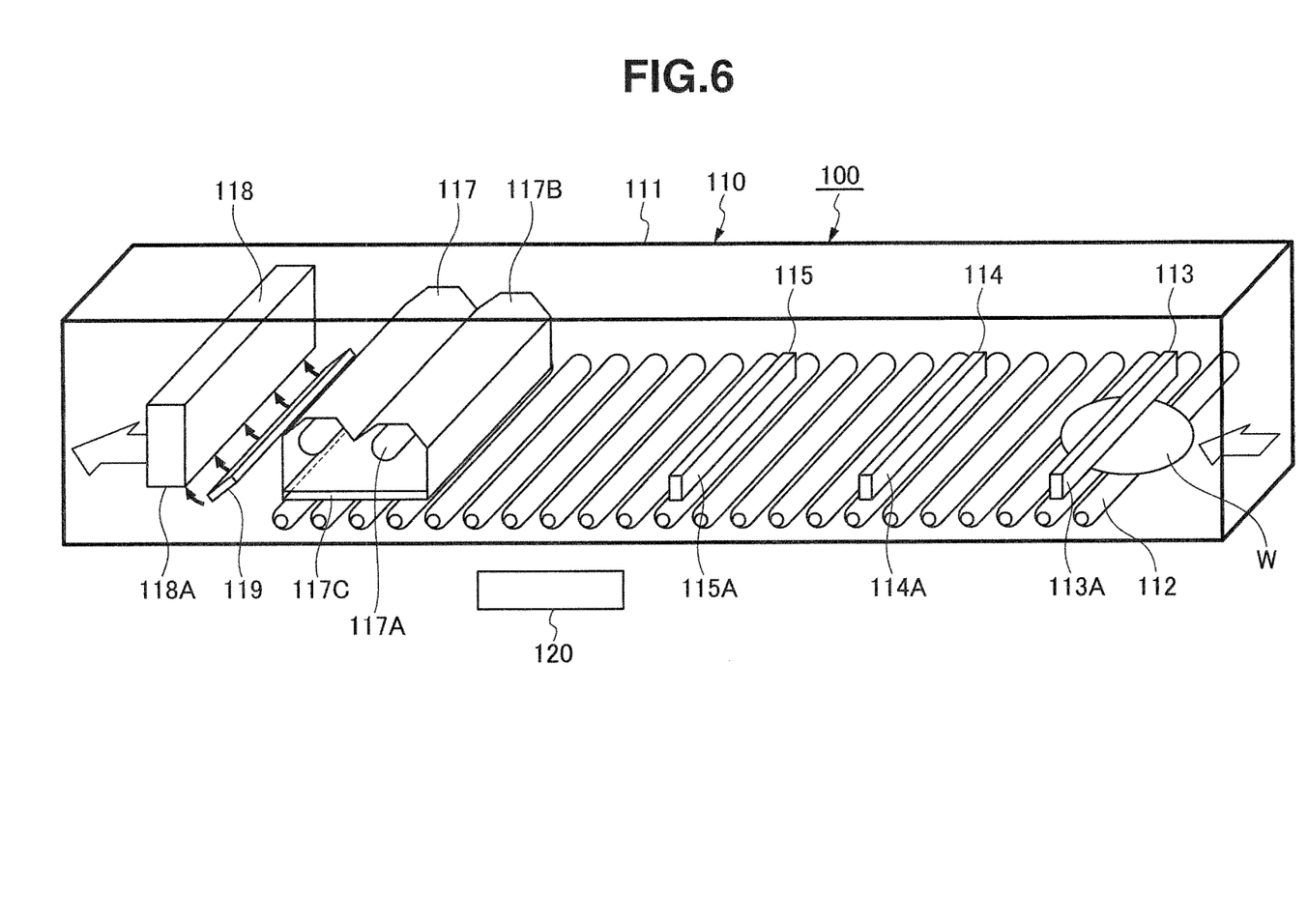
FIG. 6 is a schematic view illustrating a modification of the substrate processing device.

FIGS. 5 and 6

A substrate processing device 100 of Embodiment 2 includes a tunnel-like processing box 111 forming a substrate processing chamber 110, and a plurality of transport rollers 112 forming a transporting unit in the processing box 111 and transporting substrates W. Further, the substrate processing device 100 includes a chemical solution supply unit 113 supplying a chemical solution to a surface of the substrate W on the transport rollers 112, a cleaning liquid supply unit 114 supplying a cleaning liquid to the surface of the substrate W on the transport rollers 112, a solvent supply unit 115 supplying a volatile solvent, a gas supply unit 116 supplying a gas to the surface of the substrate W on the transport rollers 112, a heating unit 117 heating the substrate W supplied with the volatile solvent, a suction drying unit 118 for drying the surface of the substrate W heated by the heating unit 117, and a controller 120 controlling the various portions.

The processing box 111 has a tunnel-like form. It receives the unprocessed substrate W through an upstream opening, and discharges the substrate W cleaned and dried in the substrate processing chamber 110 through a downstream opening of the processing box 111.

The transport rollers 112 are driven to rotate by a drive unit such as a motor (not illustrated), and transport the substrate W fed through the upstream opening of the processing box 111 toward the downstream opening along a lower transport passage of the chemical solution supply unit 113, cleaning liquid supply unit 114, solvent supply unit 115, gas supply unit 116, heating unit 117, and suction drying unit 118. The transport rollers 112 are electrically connected to the controller 120, which controls the drive thereof. In FIGS. 5 and 6, the chemical solution supply unit 113, cleaning liquid supply unit 114 and solvent supply unit 115 are arranged in the transporting direction of the substrate W and successively neighbor to each other. However, the arrangement pitches thereof are larger than a length of the transported substrate W in the transporting direction, and are appropriately set according to liquid supply rates of the respective supply unit.

The chemical solution supply unit 113 has a slit-like nozzle 113A discharging a chemical solution downward to the widthwise full area of the surface of the substrate W on the transport rollers 112, and supplies the chemical solution such as APM (Ammonia and hydrogen Peroxide water Mixture) for resist-peeling processing to the surface of the substrate W on the transport rollers 112 through the nozzle 113A. The chemical solution supply unit 113 is electrically connected to the controller 120, which controls the drive thereof. The chemical solution supply unit 113 includes a tank storing the chemical solution, a pump serving as a drive source, a valve serving as a regulator valve regulating a supply rate, and others, although not illustrated.

The cleaning liquid supply unit 114 has a slit-like nozzle 114A discharging the cleaning liquid downward to the widthwise full area of the surface of the substrate W on the transport rollers 112, and supplies the cleaning liquid such as pure water (ultrapure water) for cleaning processing to the surface of the substrate W on the transport rollers 112 through the nozzle 114A. The cleaning liquid supply unit 114 is electrically connected to the controller 120, which controls the drive thereof. The cleaning liquid supply unit 114 includes a tank storing the cleaning liquid, a pump serving as a drive source, a valve serving as a regulator valve regulating a supply rate, and others, although not illustrated.

The solvent supply unit 115 has a slit-like nozzle 115A discharging the volatile solvent downward to the widthwise full area of the surface of the substrate W on the transport rollers 112, and supplies the volatile solvent such as IPA to the surface of the substrate W on the transport rollers 112 through the nozzle 115A. The solvent supply unit 115 supplies the volatile solvent to the surface of the substrate W already supplied with the cleaning liquid from the cleaning liquid supply unit 114, and replaces the cleaning liquid on the surface of the substrate W with the volatile solvent. The solvent supply unit 115 is electrically connected to the controller 120, which controls the drive thereof. The solvent supply unit 115 includes a tank storing the volatile solvent, a pump serving as a drive source, a valve serving as a regulator valve regulating a supply rate, and others, although not illustrated.

The gas supply unit 116 is located upstream, in the substrate transporting direction of the transport rollers 112, to the heating unit 117, and is arranged above the transport rollers 112. The gas supply unit 116 has a slit-like nozzle 116A obliquely discharging a gas to the widthwise full area of the surface of the substrate W on the transport rollers 112, and supplies through the nozzle 116A a gas, e.g., an inert gas such as nitrogen gas to the surface of the substrate W on the transport rollers 112 to form a nitrogen gas atmosphere in the space on the surface of the substrate W in the processing box 111. The nozzle 116A is attached to the processing box 111, and its angle, discharging flow velocity and others are adjusted to supply the gas to the widthwise full area of the surface of the substrate W. This gas supply unit 116 is electrically connected to the controller 120, which controls the drive of the gas supply unit 116. The gas supply unit 116 includes a tank storing the gas, a valve serving as a regulator valve regulating a supply rate, and others, although not illustrated.

The heating unit 117 has a plurality of lamps 117A, is arranged above the transport rollers 112, and each of the lamps 117A is turned on to irradiate the surface of the substrate W on the transport rollers 112 with light. The heating unit 117 heats the substrate W by irradiating the widthwise full area of the surface of the substrate W with the light emitted through a transparent cover 117C from the lamps 117A arranged in a lamp casing 117B attached to the processing box 111. This heating unit 117 is electrically connected to the controller 120, which controls the drive of the heating unit 117.

In heating of the substrate W using the heating unit 117, as illustrated in FIG. 7A, the heating by the heating unit 117 causes liquid A1 of the volatile solvent in contact with a pattern P on the surface of the substrate W to start evaporation earlier than the liquid A1 of the volatile solvent on the other portion. Thereby, gasification (boiling) of the liquid A1 of the volatile solvent forms a gas layer (collection of bubbles), namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

The suction drying unit 118 is located downstream, in the substrate transporting direction of the transport rollers 112, from the heating unit 117 and is arranged above the transport rollers 112. The suction drying unit 118 is attached to the processing box 111 and has a solvent suction port 118A of a slit-like form opening toward the widthwise full area of the surface of the substrate W on the transport rollers 112. The suction drying unit 118 applies a suction force provided to the solvent suction port 118A to the widthwise full area of the surface of the substrate W, and dries the surface of the substrate W by absorbing and removing the droplets of the volatile solvent produced on the surface of the substrate W by the heating operation of the heating unit 117 as described above. This suction drying unit 118 is electrically connected to the controller 120, which controls the drive of the suction drying unit 118. A vacuum pump (not illustrated) for absorbing the droplets of the volatile solvent is connected to the solvent suction port 118A.

In the substrate processing chamber 110, a blow-off drying unit may be used together with the suction drying unit 118. This blow-off drying unit blows and removes the droplets of the volatile solvent produced on the surface of the substrate W by an injection gas to dry the surface of the substrate W. The gas supply unit 116 described above may also be used as this blow-off drying unit.

FIG. 6 illustrates a modification of the substrate processing chamber 110. This modification is provided with a blow-off drying unit 119 injecting an inert gas such as nitrogen gas to a downstream side of the heating unit 117 in the substrate transporting direction of the transport rollers 112 when an atmosphere forming unit (not illustrated) controls the space on the surface of the substrate W in the processing box 111 to keep a nitrogen gas atmosphere, and is configured to blow and remove the droplets of the volatile solvent produced on the surface of the substrate W by the blow-off drying unit 119.

Procedures of cleaning and drying the substrate W by the substrate processing device 100 will now be described below.

(1) When the substrate W such as a liquid crystal substrate is transported onto the transport rollers 112 through the upstream opening of the processing box 111 in the substrate processing chamber 110, the controller 120 controls the chemical solution supply unit 113 to supply the chemical solution, i.e., APM through the nozzle 113A to the widthwise full area of the surface of the substrate W on the transport rollers 112 for a predetermined time. Thereby, the surface of the substrate W on the transport rollers 112 is covered and processed by the APM.

(2) Then, after stopping the supply of the chemical solution, the controller 120 controls the cleaning liquid supply unit 114 to supply the cleaning liquid, i.e., ultrapure water through the nozzle 114A to the widthwise full area of the surface of the substrate W on the transport rollers 112 for a predetermined time. Thereby, the surface of the substrate W on the transport rollers 112 is covered and cleaned by the ultrapure water.

(3) Then, the controller 120 controls the solvent supply unit 115 to supply the volatile solvent, i.e., IPA from the nozzle 115A to the widthwise full area of the surface of the substrate W on the transport rollers 112 for a predetermined time. Thereby, the ultrapure water on the surface of the substrate W on the transport rollers 112 is replaced with the IPA.

(4) Then, the controller 120 controls the gas supply unit 116 to supply a gas, i.e., nitrogen gas from the nozzle 116A to the surface of the substrate W on the transport rollers 112 for a predetermined time. The nozzle 116A ejects the nitrogen gas to the widthwise full area of the substrate W on the transport rollers 112. Thereby, the nitrogen atmosphere is formed in the space containing the substrate W on the transport rollers 112. By keeping the nitrogen atmosphere in this space, the oxygen concentration is reduced to suppress generation of watermarks on the surface of the substrate W.

(5) Then, the controller 120 controls the heating unit 117 to turn on each lamp 117A of the heating unit 117 to heat the substrate W on the transport rollers 112 for a predetermined time. At this time, the heating unit 117 can perform the heating that can raise the temperature of the substrate W to 100 degrees or above in 10 seconds. This can instantaneously vaporize the liquid A1 of the volatile solvent in contact with the pattern P on the surface of the substrate W, and can immediately form the droplets of the liquid A1 of the volatile solvent on the other portion of the surface of the substrate W.

In the above heat drying by the heating unit 117, it is important to heat the substrate W to a high temperature of hundreds of degrees within several seconds for instantaneously evaporating the volatile solvent, i.e., IPA in contact with the pattern P of the substrate W. It is necessary to heat only the substrate W without heating the IPA. For this, it is desirable to use the lamp 117A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially within 10 seconds and, for example, falls within a range from several tens of milliseconds to several seconds.

(6) Then, the controller 120 controls the suction drying unit 118 to absorb and remove the droplets of the IPA which were produced on the surface of the substrate W by the heating operation of the heating unit 117 on the transport rollers 112, and thereby dries the surface of the substrate W.

(7) Then, the substrate W that is already washed and dried on the transport rollers 112 is taken out through the downstream opening of the processing box 111 in the substrate processing chamber 110, and the substrate W is discharged for downstream processing.

Accordingly, in the substrate processing device 100, the heating unit 117 and the suction drying unit 118 (the gas supply unit 116 serving as the blow-off drying unit, or the blow-off drying unit 119 may be used together with them) are arranged in the course of transportation of the substrate W transported from the solvent supply unit 115 by the transport rollers 112. Heating the substrate W by the heating unit 117 and drying the surface of the substrate W by the suction drying unit 118 are executed in the transportation of transporting the substrate W supplied with the volatile solvent from the solvent supply unit 115 and being transported by the transport rollers 112.

The embodiment achieves the following operation and effect.

(a) The operation of heating the substrate W by the heating unit 117 vaporizes the liquid of the volatile solvent, i.e., IPA used for replacement around the pattern P on the surface of the substrate W so that a gas layer of the vapored IPA forms a thin film around the pattern P on the surface of the substrate W. The liquid of IPA between the neighboring patterns P of the substrate W is pushed out by the gas layer, and is changed into a large number of droplets by its own surface tension. The droplets of the IPA formed on the surface of the substrate W in this manner are immediately absorbed and removed from the surface of the substrate W by the suction drying unit 118 (which can be used with the gas supply unit 116 serving as the blow-off drying unit, and/or the blow-off drying unit 119). Accordingly, the liquid of IPA can be dried instantaneously on the whole surface of the substrate W, and the drying speeds of various portions of the surface of the substrate W can be uniform so that remaining of the IPA between certain patterns P does not occur, and it is possible to suppress collapsing of the patterns P due to the surface tension of the liquid of the remaining IPA.

(b) The heating unit 117 and the suction drying unit 118 are arranged in the course of transportation of the substrate W transported from the solvent supply unit 115. Therefore, the operation of cleaning the following substrate W by the cleaning liquid supply unit 114 and the solvent supply unit 115 and the operation of drying the preceding substrate W by the heating unit 117 and the suction drying unit 118 can be performed in parallel with each other at different positions, respectively, so that the productivity of the substrates W can be improved. Further, the heating unit 117 and the suction drying unit 118 perform the drying operation during the transportation of the substrate W. This can also improve the productivity of the substrates W. Accordingly, even when the substrates W have large sizes, the productivity thereof can be improved.

Although the invention has been described in detail with reference to the drawings, the specific structure of the invention is not restricted to these embodiments, and the invention contains changes and variations of design within a scope not departing from the essence of the invention.

For example, in Embodiment 1, the volatile solvent on the substrate may dry while the substrate W is being transported from the substrate cleaning chamber 40 to the substrate drying chamber 60. Therefore, a supply device of the volatile solvent may be arranged in an opening upstream to the processing box 61 in the substrate drying chamber 60 illustrated in FIGS. 3 and 4, the substrate W already supplied with the cleaning liquid in the substrate cleaning chamber 40 may be transported to the substrate drying chamber 60, and the volatile solvent may be supplied to the surface of the substrate W when the substrate W is fed into the substrate drying chamber 60.

In the embodiment, the transport rollers 62 or 112 transport the substrate W. However, the substrate W may be transported by clamping the substrate W with a clamper instead of the roller.

As the drying unit, the suction drying units 65 and 118 may be eliminated, and only the blow-off drying unit (the gas supply unit 63 or 116, or the blow-off drying unit 67 or 119) may be arranged to blow off, from the substrate, the droplets of the IPA produced by the heating operation of the substrate W by the heating unit 64 or 117, and thereby to remove the droplets of the IPA from the substrate for drying the substrate W. In this case, it is preferable to arrange a collection unit such as a receiving member for receiving the blown IPA under the processing box 61 or 111. Further, the droplets of the IPA produced by the heating operation of the substrate W may be removed by inclining the substrate W.

For example, in Embodiment 2, the chemical solution, cleaning liquid, volatile solvent and the like are successively supplied to the substrate W while the substrate W is being transported. However, such a configuration may be employed that the transport rollers 112 or the like are used for transporting the substrate W, the transported substrate W is successively stopped at positions where a central portion, in the transporting direction, of the substrate is opposed to the nozzles 113A, 114A, and 115A, discharging the chemical solution, cleaning liquid and volatile solvent, respectively, and the respective nozzles supply the processing liquids such as the chemical solution to the stopped substrate W. Likewise, the heating of the substrate W by the heating unit 117 may be performed while the substrate W is stopped.

As is done in Embodiment 1, the out-dedicated buffers 32 may be arranged in multiple stages, and the substrate drying chamber 60 may be arranged in each stage. In this structure, the drying processing can take place in parallel in the respective stages so that the substrate processing capacity can be increased. However, the out-dedicated buffer 32 may be arranged in one stage instead of the multiple stages, and the substrate drying chamber may be arranged in this stage.

The operation of supplying the inert gas such as nitrogen gas by each of the gas supply units 63, 116 is configured to start after the substrate W is positioned in the supply position, but the operation may start before the positioning.

For example, in Embodiment 1, the heating of the substrate W by the heating unit 64 may be performed in a state where the pressure in the processing box 61 is reduced. This lowers the boiling point of the volatile solvent such as IPA in the processing box 61, and causes boiling at a temperature lower than that in the atmospheric pressure so that the heat damage to the substrate can be reduced.

In each embodiment, the supply of the volatile solvent such as IPA to the substrate W starts after the supply of the cleaning liquid to the substrate W stops. However, the supply of the volatile solvent may start while the supply of the cleaning liquid to the substrate W still continues in a final period of the cleaning with the cleaning liquid. In this case, in Embodiment 2, this can be carried out by setting the arrangement pitches between the cleaning liquid supply unit 114 and the solvent supply unit 115 to smaller pitches than a length of the transported substrate W in the transporting direction.

In each embodiment, a gas to be supplied can be a gas that is heated.

In each embodiment, it is desirable to supply an inert gas such as dried air or nitrogen gas into the processing boxes 41, 111 before supplying the volatile solvent such as the IPA to the substrate W.

Without arranging the suction drying unit 65 or 118, a blow-off drying unit (the gas supply unit 63 or 116, or the blow-off drying unit 67 or 119) may be arranged to blow off, from the substrate, the droplets of the IPA produced by the heating operation of the substrate W by the heating unit 64 or 117, and thereby to remove the droplets of IPA from the substrate for drying the substrate W. A discharge portion arranged below the processing box 61 or 111 may be configured to discharge externally the droplets of the blown droplets of the IPA through it.

INDUSTRIAL APPLICABILITY

The invention can provide the substrate processing device and the substrate processing method that instantaneously dry the liquid on the surface during drying of the substrate, and improve the productivity of the substrate.

EXPLANATIONS OF LETTERS OF NUMERALS

10, 100 substrate processing device
47, 114 cleaning liquid supply unit
48, 115 solvent supply unit
62, 112 transport roller
64, 117 heating unit
65, 118 suction drying unit (drying unit)
67, 119 blow-off drying unit (drying unit)
W substrate

What is claimed is:

1. A substrate processing device comprising:
a cleaning liquid supply unit supplying a cleaning liquid to a surface with a pattern of a substrate;
a solvent supply unit supplying a liquid volatile solvent to the surface of the substrate supplied with the cleaning liquid to replace the cleaning liquid on the surface of the substrate with the liquid volatile solvent;
a heating unit heating the substrate supplied with the volatile solvent and producing droplets of the volatile solvent on the surface with the pattern of the substrate by a heating operation of the heating unit,
a drying unit drying the surface of the substrate by removing the droplet, and
a transport roller transporting the substrate, wherein
the heating unit has a lamp irradiating the substrate with light having a peak intensity in wavelengths between 500 nm and 3000 nm,
the drying unit is a suction drying unit comprising a vacuum pump and a solvent suction port to remove the droplet of the volatile solvent from the surface of the substrate,
the heating unit and the solvent suction port are provided being along the substrate transporting direction by the transport roller, and facing the surface with the pattern of the substrate transported by the transport roller,
the solvent suction port is located downstream from the heating unit and is adjacent to it, and
wherein the solvent suction port has a substantially equal width to the width of the substrate on the transport roller.

2. The substrate processing device according to claim 1, further having
a substrate supply/discharge unit which accommodates a plurality of substrates,
a buffer unit to store the substrate which has been cleaned in the solvent supply unit, before the substrate is transported to the substrate supply/discharge unit,
the heating unit and drying unit are provided in the buffer unit.

3. The substrate processing device according to claim 1, wherein
the heating unit and drying unit are provided in a tunnel-like processing box having two openings,
the substrate is fed to the processing box through one of the openings, and is discharged from the processing box through the other of the openings.

4. A substrate processing device comprising:
a cleaning liquid supply unit supplying a cleaning liquid to a surface with a pattern of a substrate;
a solvent supply unit supplying a liquid volatile solvent to the surface of the substrate supplied with the cleaning liquid to replace the cleaning liquid on the surface of the substrate with the liquid volatile solvent;
a heating unit heating the substrate supplied with the volatile solvent and producing droplets of the volatile solvent on the surface with the pattern of the substrate by a heating operation of the heating unit,
a drying unit drying the surface of the substrate by removing the droplets, and
a transport roller transporting the substrate, wherein
the heating unit has a lamp irradiating the substrate with light having a peak intensity in wavelengths between 500 nm and 3000 nm,
the drying unit comprises a blow-off drying unit supplying a gas to blow off the droplet of the volatile solvent from the surface of the substrate, and a suction drying unit having a vacuum pump and a solvent suction port connected to the vacuum pump,
the heating unit, the blow-off drying unit, and the solvent suction port are provided being along the substrate transporting direction by the transport roller, and facing the surface with the pattern of the substrate, during the transportation of the substrate transported by the transport roller,
the solvent suction port and the blow-off drying unit are located downstream from the heating unit,
the blow-off drying unit is adjacent to the heating unit,
the solvent suction port is adjacent to the blow-off drying unit, and
wherein the solvent suction port has a substantially equal width to the width of the substrate on the transport roller.

5. The substrate processing device according to claim 4, further having
a substrate supply/discharge unit which accommodates a plurality of substrates,
a buffer unit to store the substrate which has been cleaned in the solvent supply unit, before the substrate is transported to the substrate supply/discharge unit,
the heating unit and drying unit are provided in the buffer unit.

6. The substrate processing device according to claim 4, wherein
the heating unit and the drying unit are provided in a tunnel-like processing box having two openings,
the substrate is fed to the processing box through one of the openings, and is discharged from the processing box through the other of the openings.

7. The substrate processing device according to claim 1, wherein the solvent suction port opens in slit-like form.

* * * * *